United States Patent Office 3,547,691

Patented Dec. 15, 1970

3,547,691

METHOD AND COMPOSITION FOR STABILIZING THE REVERSE VOLTAGE PROPERTIES OF SEMICONDUCTOR DEVICES

Rolf Berkner, Wolkersdorf, near Nuremburg, Germany, assignor to Semikron Gesellschaft für Gleichrichterbau und Elektronik m.b.H., Nuremburg, Germany No Drawing. Continuation-in-part of application Ser. No. 633,408, Apr. 25, 1967. This application July 11, 1967, Ser. No. 652,431

Claims priority, application Germany, Apr. 27, 1966, S 103,446

Int. Cl. B44d *1/18*; C23c *13/04*

U.S. Cl. 117—201 24 Claims

ABSTRACT OF THE DISCLOSURE

Stabilizing the reverse voltage properties of a semiconductor device by providing the surface of such a device with a layer of a mixture composed of at least 50% by weight of at least one polymerized and/or condensed organic substance and up to 50% by weight of a pulverized, soluble organic gettering substance exhibiting a gettering effect in its dissolved state, the gettering substance acting to purify the surface of the device and to simultaneously cover it with a protective coating.

CROSS REFERENCE TO RELATED APPLICATION

This application is a continuation-in-part of copending application Ser. No. 633,408, filed Apr. 25, 1967 now abandoned.

BACKGROUND OF THE INVENTION

The present invention relates to the processing of semiconductor devices, and particularly to a special chemophysical surface treatment of semiconductor devices for preserving their surfaces in such a way as to stabilize the electrical properties of the semiconductor device.

It is known that the surface of a semiconductor device must meet exacting requirements during operation, particularly in those regions where a pn junction extends to the surface since it is at these external regions where the junction depletion layer is subjected to the highest field intensities created by a reverse voltage. Even the slightest impurity on the surface of this external zone of the depletion layer will have the effect of substantially reducing the field intensity which the pn junction can support and will thus destroy the ability of the device to withstand high reverse voltages.

Since impurities appearing on the surface of the semiconductor device due to changes in the atmosphere are themselves sufficient to noticeably decrease the reverse voltage capacitance, it is necessary to thoroughly clean and preserve the surface of a semiconductor device during manufacture in order to stabilize the reverse blocking action imparted to the device, and consequently its reverse characteristics.

A known method for stabilizing the reverse voltage, or blocking, properties of semiconductor devices consists, for example, in purposely forming a semiconductor oxide layer at the purified surface area. It is also known to form an oxide layer by means of rinsing or etching with oxidizing liquid reagents. Annealing and irradiation processes for the production of a semiconductor oxide layer are also known. In these processes, the purified semiconductor device is subjected to the annealing or irradiation treatment in the presence of oxidizing gases or solid materials within a closed area.

A particularly thick protective layer can be achieved by the known electrochemical treatment process according to which the semiconductor device is brought into contact with organic or inorganic liquids which are chosen according to the type of oxide layers it is desired to form on the semiconductor devices and according to the function which these oxide layers are to perform. Thus, protective layers are known which are designed to produce quite well defined physical effects, such protective layers being, for example, in the form of highly purified, electrically insulating protective layers, or insulating protective layers with additives to increase the resulting dielectric constant or the dipole moment, for example, or protective layers to prevent or sufficiently delay an additional diffusion of impurity components from gases or vapors.

Since the purified, unprotected surface of a semiconductor device tends to accept undesired foreign matter and thus creates instabilities in the semiconductor device, a protective layer on the surface of the semiconductor device is absolutely necessary in order to produce an operable structural element having essentially stable electrical properties. The need for such coating can be eliminated only if the purified, electrically unstable semiconductor device can be brought into a particular gaseous atmosphere and can be maintained therein.

The known methods for producing a desired protective layer possess more or less serious drawbacks which are inherent, on the one hand, in the techniques employed for carrying out the process in practice and, on the other hand, in the expenditures required and the limitations imposed by the field of use of the resulting device. For example, a diffusion of undesired components into the protective layers produced in an annealing process can hardly be prevented since such processes extend over relatively long periods of time and since diffusions resulting thereof can not be avoided.

SUMMARY OF THE INVENTION

It is therefore a primary object of the present invention to stabilize the reverse voltage properties of a semiconductor device while avoiding the above-mentioned drawbacks of the known processes.

Another object of the present invention is to provide the surface of such device with a protective coating which purifies the surface.

Yet another object of the present invention is to provide the surface of such a device with a protective layer including a gettering substance.

These and other objects according to the present invention are achieved by stabilizing the blocking properties of semiconductor devices by a chemophysical treatment of their surfaces. This is carried out by forming on such surfaces a layer of a mixture including at least 50% by weight of at least one substance from a group consisting of polymerized organic substances and/or condensed organic substances, and up to 50% by weight of a pulverized soluble organic additive substance having a gettering effect when in a dissolved state, whereby the additive substance purifies, and provides a protective coating for, such surfaces.

DESCRIPTION OF THE PREFERRED EMBODIMENT

The method according to the present invention is simple and does not require great expenditures for the mass-production of semiconductor devices. Nor does it present drawbacks inherent in the known methods.

The invention relates to a method for stabilizing the reverse voltage, or blocking, properties of semiconductor devices by means of a chemophysical surface treatment for gettering and preserving the surface and consists in that a polymerizable and/or condensable organic substance is combined with up to 50% by weight of a pulverized soluble organic substance which in its dissolved state possesses a gettering effect, and that this latter substance, when the resulting mixture has been applied to the surface of the semiconductor device and upon completion of the subsequently instituted polymerization and/or condensation processes, purifies the surface and simultaneously provides it with a protective coating.

Polymerizable and/or condensable organic substances are applied to the surface of a semiconductor device, after pulverized organic substances were added thereto in amounts up to 50% by weight, which pulverized substances have a gettering effect upon completion of polymerization and/or condensation process, and are present in a state ranging from traces to being completely dissolved.

Prepolymerized and/or precondensed substances can also take the place of the polymerizable and/or condensable substances.

The impurities caused by atoms, ions or molecules which may be deposited on the semiconductor surface by adsorption or electrochemical deposition are removed from the semiconductor surface by the gettering effect of the applied mixture.

The composition of a mixture as well as the effect of the composition on the semiconductor surface depends on three factors given for a particular semiconductor element: the permissible surface temperature, the operating and the testing conditions.

The gettering effect of the mixture used occurs when the gettering substance has reached its highest degree of distribution, as dependent upon the solubility and preliminary treatment of the base substance, and when the polymerizable and/or condensable base substance has nearly reached its final molecular state.

To this end the mixture used is subjected to a temperature treatment according to well-known techniques. The temperature and the time of the treatment is determined by the physical properties of the polymerizable and/or condensable substance, the solubility of the gettering substance and, in addition, the maximum permissible boundary layer temperature of the intended semiconductor element. The temperature, for example, can be immediately set to the maximum permissible boundary layer temperature of the semiconductor element; for silicon semiconductor elements this is between 190° and 200° C. The length of time of the temperature treatment, which in practice is preferably between about 2 to 24 hours, is of itself not critically limited. The higher the treatment temperature, the shorter can be the treatment time.

The temperature treatment is preferably done during production of the semiconductor elements in order to insure, already at the testing stage before the semiconductor element is inserted in a semiconductor device, a sufficient gettering effect of the applied mixture and in turn a stable reverse voltage property.

The mixture used can be applied in the liquid condition by dropping it, painting it, spraying it on the semiconductor surface; or by immersing the semiconductor body into the liquid. It is further possible to attach a prepolymerized and/or precondensed mixture in its solid state to the semiconductor surface if it is preformed to the proper geometry. The mixture can then be brought to its final molecular state.

The protective layer of the mixture used upon the semiconductor surface can be made as thick as desired. The layer thickness is preferably between 0.1 and 0.5 mm. The protective layer should be made correspondingly thicker for angular semiconductor elements to insure sufficient coverage of corners occurring at the pn junction.

As polymers the following substances will be used: silicones, epoxy resins, terephthalic acid ester lacquers, glyptal resins, polyester resins and others.

The polymerizable substances and the condensable substances may be polymerized and condensed, respectively, according to any well-known techniques, which techniques will not be discussed in detail herein.

The added pulverized substances comprise primarily such organic compounds as will form stable coordinate linkages with the impurity, i.e. organic complexing compounds.

Four groups of materials show a particularly favorable gettering effect and, when applied in conjunction with the organic polymer substances, achieve a purification of the surface as well as providing the desired protective coating. These groups are the derivatives of the anthraquinones, the phthalocyanines, the derivatives of xanthene, as well as the azo dyestuffs.

Among the anthraquinones, those reacting particularly favorably are purpurin, alizarin, quinizarin, anthrarufin, quinalizarin, as well as anthraquinone with chelate-forming substituents, particularly hydroxy- and/or polyhydroxyanthraquinone with at least one hydroxy group in the $\alpha$-position, as well as aminoanthraquinone derivatives having an $\alpha$-amino group.

In the group of the phthalocyanines as additives to the organic matter of the polymers, phthalocyanines free of metal are particularly suitable.

Furthermore, among the derivatives of xanthene, preference is given to the use of fluoresceins, e.g., eosines, erythrosines, phloxines, cyanosines, Bengal rose, gelleins, rhodamines and violamines.

Finally, among the group of the azo dyestuffs, one or a plurality of mono- and/or polyazo dyestuffs are particularly applicable, preferably with chelate-forming substituents, as organic additives to the organic substance of the polymers to achieve the desired stabilization of the blocking properties of semiconductor devices.

Set forth immediately following is an example of the effect of one of the mixtures according to the invention. It will be seen that this mixture significantly stabilizes the reverse voltage property of semiconductor elements Subsequent to this are given examples of the use of four mixtures according to the invention. The invention is, however, not limited to any of the examples.

EXAMPLE 1

Rationale for the use of a condensed polymer

A semiconductor wafer is covered with a precondensed phenyl methyl silicone resin which is dissolved at 50% by weight in an aromatic hydrocarbon, for example in toluol. The mixture contains no additive gettering substance. The protective layer is heat-treated for 20 hours at a temperature of 170°–190° C. Such surface treatment produces semiconductor elements with desired controlled avalanche behavior.

To test the stability of the reverse voltage property, samples were subjected to a week-long temperature test at 150° C. At the termination of this time 80% of the samples were of rejectable quality; some showed instability of the controlled avalanche characteristic, some severe deterioration and some complete deterioration of the reverse voltage property. In a subsequent series of tests with the same mixture, the same test conditions, the maximum yield of test samples with desired reverse voltage characteristics varied between 0% and 20%. This result can be explained by the phenomena of diffusion of undesired foreign matter in the area immediately surrounding the semiconductor surface.

For a comparison test finely pulverized fluorescein, a gettering substance, was added to the precondensed silicon resin solution at 10% by weight. Semiconductor elements treated with this mixture in accordance with the invention were heated to 150° C. for over 1000 hours. 50% and more of the test samples had the desired controlled avalanche characteristic.

EXAMPLE 2

Treatment with a condensed polymer

Precondensed methylpolysiloxane is dissolved in an equal volume of cyclohexanone; to the solution is added metal-free phthalocyanine, a gettering substance, at 5% by weight. A semiconductor wafer covered with this mixture is heat-treated at 180° C. for 15–20 hours. The solvent will evaporate during the temperature treatment so that after the condensation phenomena have been taken into account the mixture in its final molecular state will consist of approximately 92% condensed substance and 8% additive gettering substance. This preparation of the surface of the semiconductor element is suitable for operating temperatures up to a maximum of 180° C.

EXAMPLE 3

Treatment with a condensed polymer

A condensed mixture composed of 80% by weight of phenylmethylpolysiloxane and of 20% by weight of a precondensed polyester resin is dissolved in an equal volume of xylol. Into this solution is added 20% by weight of fine pulverized gallein, a gettering substance. A semiconductor wafer treated with this mixture is heated at a temperature of 190° C. for 16 to 20 hours. After the evaporation of the solution, allowing for condensation phenomena, the mixture in its final state is composed 70% of condensed substance and 30% of additive gettering subtance. This surface treatment makes possible a maximum operating temperature for the semiconductor element of 200° C.

EXAMPLE 4

Treatment with a polymeride (additive polymerization)

Four parts of epoxy resin (base: bisphenol epichlorohydrin; epoxy equivalent: 180–190; viscosity at 25° C.: 12,000 cp.) are mixed with 5 parts hexachloroendomethylene tetrahydrophthalic acid anhydride. To this mixture is added 10% by weight of fine pulverized 1,2,5,8-tetrahydroxyanthraquinone, as an additive gettering substance. A semiconductor wafer covered with this mixture is heated to between 160°–170° C. for approximately 16 hours. The composition remains unchanged during the temperature treatment; at the end of the treatment the mixture remains 90% by weight polymerized substance and 10% additive gettering substance. This surface treatment makes possible a maximum operating temperature of semiconductor elements of 120° C.

EXAMPLE 5

Treatment with a polymeride (additive polymerization)

Epoxy resin (base: bisphenol epichlorohydrin; epoxy equivalent: 180–190; viscosity at 25° C.: 12,000 cp.) is mixed with an equal weight of hexahydrophthalic acid anhydride. To this mixture is added 20% by weight of purpurin as gettering substance. A semiconductor wafer treated with this mixture is heated to a temperature of 150–170° C. for 15 to 20 hours. Inasmuch as the composition of the mixture is not changed by the temperature treatment, the polymerized substance contains about 16% by weight of additive gettering substance. This surface treatment of semiconductor elements makes possible a maximum operating temperature of 80° C.

It may thus be seen that the present invention permits the blocking properties of semiconductor devices to be stabilized in a very simple, rapid and economical manner by a chemophysical surface treatment.

It will be understood that the above description of the present invention is susceptible to various modifications, changes, and adaptations, and the same are intended to be comprehended within the meaning and range of equivalents of the appended claims.

I claim:

1. A method for stabilizing the blocking properties of semiconductor devices by chemophysical treatment of their surfaces, said surfaces containing an impurity particle, comprising: forming on such surfaces a productive layer from a mixture of (a) a pulverized organic additive which forms stable coordinate linkages with the particle and is a member selected from the group consisting of a phthalocyanine, an azo dyestuff, xanthene, eosine, erythrosine, phloxine, cyanosine, Bengal rose, gallein, rhodamine, violamine and hydroxyl-free anthraquinones having chelate-forming substituents, and (b) a base substance means for holding the additive distributed throughout the layer.

2. A method as claimed in claim 1, wherein said additive is a phthalocyanine.

3. A method as claimed in claim 2, wherein the phthalocyanine is a metal-free phthalocyanine.

4. A method as claimed in claim 3, wherein metal-free phthalocyanine is phthalocyanine.

5. A method as claimed in claim 1, wherein said additive is a member selected from the group consisting of monoazo and polyazo dyestuffs.

6. A method as claimed in claim 5, wherein said additive is a member selected from the group consisting of monoazo and polyazo dyestuffs having chelate-forming substituents.

7. A method as claimed in claim 1, wherein said additive is a member selected from the group consisting of xanthene eosine, erythrosine, phloxine, cyanosine, Bengal rose, gallein, rhodamine and violamine.

8. A method as claimed in claim 7, wherein said additive is gallein.

9. A method as claimed in claim 1, wherein said additive is a hydroxyl-free anthraquinone having chelate-forming substituents.

10. A method as claimed in claim 9, wherein said additive is a hydroxyl-free anthraquinone having an α-amino group.

11. A method as claimed in claim 1, wherein said base substance means is an organic polymerizable and or condensable material and is prepolymerized and/or precondensed before being applied to the surface of the semiconductor device.

12. A method as claimed in claim 1, wherein said base substance means is a polymerizable and/or condensable material and is selected from the group consisting of a phenylmethylsilicone resin, a methylsilicone resin, a condensable mixture of a phenylmethylsilicone resin and a polyester resin, a condensable mixture of a phenylmethylsilicone resin and a bisphenol-epoxy resin, a mixture of an epoxy resin and hexachloroendomethylene terehydrophthalic acid anhydride, and a mixture of an epoxy resin and hexahydrophthalic acid anhydride.

13. A protective layer of polymer and/or polycondensate in intimate contact with a semiconductor surface containing a predetermined impurity particle, the polymer and/or polycondensate having therein, as additive, at least one organic compound complexing with said particle and having a gettering effect when in a dissolved state, said additive comprising at most 50% by weight of the layer and chosen from the group consisting of phthalocyanines, azo dyestuffs, xanthenes excluding fluorescein and its derivatives, and hydroxyl-free anthraquinones having chelate-forming substituents.

14. A layer as claimed in claim 13, wherein said additive is chosen from the group consisting of the phthalocyanines.

15. A layer as claimed in claim 14, wherein said additive is chosen from the group consisting of metal-free phthalocyanines.

16. A layer as claimed in claim 15, wherein said additive is metal-free phthalocyanine.

17. A layer as claimed in claim 13, wherein said additive is chosen from the group consisting of monoazo and polyazo dyestuffs.

18. A layer as claimed in claim 17, wherein said additive is chosen from the group consisting of monoazo and polyazo dyestuffs having chelate-forming substituents.

19. A layer as claimed in claim 13, wherein said additive is chosen from the group consisting of xanthene derivatives excluding fluorescein and its derivatives.

20. A layer as claimed in claim 19, wherein said additive is gallein.

21. A layer as claimed in claim 13, wherein said additive is chosen from the group consisting of hydroxyl-free anthraquinone derivatives having chelate-forming substituents.

22. A layer as claimed in claim 21, wherein said additive is chosen from the group consisting of hydroxyl-free anthraquinone derivatives having an α-amino group.

23. A layer as claimed in claim 13, wherein the polymer and/or polycondensate is a member selected from the group consisting of silicones, epoxy resins, terephthalic acid ester lacquers, glyptal resins and polyester resin.

24. A layer a claimed in claim 13, wherein the polymer and/or polycondensate is a member selected from the group consisting of a phenylmethylsilicone resin, a methylsilicone resin, a condensed mixture of a phenylmethylsilicone resin and a polyester resin, a condensed mixture of a phenylmethylsilicone resin and a bisphenol-epoxy resin, a mixture of an epoxy resin and hexachloroendomethylene terehydrophthalic acid anhydride, and a mixture of an epoxy resin and hexahydrophthalic acid anhydride.

References Cited

UNITED STATES PATENTS

| | | | |
|---|---|---|---|
| 2,798,064 | 7/1957 | Mueller | 260—37(Si)UX |
| 2,795,680 | 6/1957 | Peck | 260—37(Ep)X |
| 2,798,189 | 7/1957 | Alexander | 117—230UX |
| 2,855,378 | 10/1958 | Braley | 260—37(Si) |
| 3,052,540 | 9/1962 | Greig | 260—37(Si)X |
| 3,251,786 | 5/1966 | Edmunds | 260—37(Ep)X |
| 3,318,714 | 5/1967 | Coney et al. | 260—37(Si)UX |
| 3,341,367 | 9/1967 | Beyerlein | 317—235(46)UX |
| 3,342,802 | 9/1967 | Ribka et al. | 260—37(Ep)X |
| 3,160,520 | 12/1964 | Jäntsch et al. | 117—201 |

OTHER REFERENCES

Noller: Chemistry of Organic Compounds, W. B. Saunders Co., 1965, pp. 752, 753, 756, 757, 773, 774, Sci. Lib., QD 253 N65.

WILLIAM L. JARVIS, Primary Examiner

U.S. Cl. X.R.

117—230; 260—37